United States Patent
Hurwitz et al.

(10) Patent No.: US 9,941,353 B2
(45) Date of Patent: Apr. 10, 2018

(54) STRUCTURE AND METHOD FOR MITIGATING SUBSTRATE PARASITICS IN BULK HIGH RESISTIVITY SUBSTRATE TECHNOLOGY

(71) Applicant: Newport Fab, LLC, Newport Beach, CA (US)

(72) Inventors: Paul D. Hurwitz, Irvine, CA (US); Edward Preisler, San Clemente, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/160,896

(22) Filed: May 20, 2016

(65) Prior Publication Data
US 2017/0338305 A1 Nov. 23, 2017

(51) Int. Cl.
H01L 29/06 (2006.01)
H01L 23/66 (2006.01)
H01L 21/762 (2006.01)

(52) U.S. Cl.
CPC .... *H01L 29/0688* (2013.01); *H01L 21/76224* (2013.01); *H01L 23/66* (2013.01); *H01L 29/0649* (2013.01); *H01L 29/0638* (2013.01)

(58) Field of Classification Search
CPC .......... H01L 29/0649; H01L 29/0638
See application file for complete search history.

(56) References Cited

U.S. PATENT DOCUMENTS

| | | | | |
|---|---|---|---|---|
| 4,113,513 | A | * | 9/1978 | deBrebisson ........... H01L 21/74 257/519 |
| 4,839,306 | A | * | 6/1989 | Wakamatsu ...... H01L 21/76232 148/DIG. 158 |
| 2014/0054743 | A1 | * | 2/2014 | Hurwitz .............. H01L 29/0642 257/508 |
| 2016/0071927 | A1 | * | 3/2016 | Hurwitz ........... H01L 29/66477 257/347 |

OTHER PUBLICATIONS

K. Ben Ali et. al. "Efficient Polysilicon Passivation Layer for Crosstalk Reduction in High-Resistivity SOI Substrates"., Jan. 2010, pp. 212-215.
Gambino et. al "A High Resistivity SiGe BiCMOS Technology for WIFI Front-End-IC Solutions"., 2013, pp. 231-234.

* cited by examiner

*Primary Examiner* — Ermias Woldegeorgis
(74) *Attorney, Agent, or Firm* — Farjami & Farjami LLP (57) ABSTRACT

A structure includes a field isolation region in a high resistivity substrate, a compensation implant region under the field isolation region in the high resistivity substrate, where the compensation implant region is configured to substantially eliminate a parasitic p-n junction under the field isolation region. The parasitic p-n junction is formed between trapped charges in the field isolation region and the high resistivity substrate. The compensation implant region includes a charge of a first conductivity type to compensate a parasitic charge of a second conductivity type under the field isolation region. The compensation implant region is configured to improve linearity of RF signals propagating through a metallization layer over the field isolation region. The structure further includes a deep trench extending through the field isolation region and the compensation implant region, and a damaged region adjacent the deep trench.

18 Claims, 8 Drawing Sheets

STRUCTURE AND METHOD FOR MITIGATING SUBSTRATE PARASITICS IN BULK HIGH RESISTIVITY SUBSTRATE TECHNOLOGY

BACKGROUND

In monolithic radio frequency ("RF") circuits, losses associated with the substrate impedance have deleterious effects on performance. For example, in RF switches built on bulk substrate technology with junction isolations, parasitic substrate impedance can result in degraded linearity and voltage imbalance across large branches of stacked semiconductor devices. Other deleterious effects may include higher parasitic losses suffered by passive components (e.g., transmission lines, inductors, etc.) reflected in lower Quality Factor, and unwanted crosstalk between devices or circuit blocks through the substrate.

Some of these effects experienced by the monolithic RF circuits when utilizing bulk substrate technology can be partially mitigated by using high resistivity substrates. However, in a conventional monolithic RF circuit employing a high resistivity substrate, fixed positive charges in the dielectric layers on top of the high resistivity substrate, can induce an inversion layer in the high resistivity substrate. For example, due to the low background doping of the high resistivity substrate, the fixed positive charges can cause an accumulation of high mobility carriers of opposite polarity under the dielectric layer. This inversion layer of high mobility carriers can significantly decrease the effective resistivity of the high resistivity substrate. For example, if 1000 ohm-cm silicon is used to build a high resistivity substrate, the effective resistivity of the substrate is found to be only approximately one fifth of that value (i.e., 200 ohm-cm) based on transmission line measurements over the substrate.

Another concern associated with high resistivity substrates is that large spacing is required to avoid leakage between junctions at different potentials. That is, the large depletion regions that surround biased junctions (where one side is the low doped substrate) require very large spacings to electrically isolate these junctions. A deep dielectric filled trench in the high resistivity substrate can significantly reduce the spacing to allow smaller products. While one or more deep dielectric filled trenches can help form isolated segments or islands in the high resistivity substrate to reduce the impact of the inversion layer, these islands of inverted charges can form p-n junctions with the underlying high resistivity substrate, which function as voltage dependent diodes that can adversely impact the linearity of the RF signals routed through the metal layers over the high resistivity substrate. In addition, the capacitive coupling between one or more of the metal layers and the high resistivity substrate would also become voltage dependent, thus further degrading the linearity of the RF signals.

Thus, there is a need in the art for mitigating substrate parasitics in a high resistivity substrate and improving RF signal linearity of monolithic RF circuits integrated on the high resistivity substrate.

SUMMARY

The present disclosure is directed to structure and method for mitigating substrate parasitics in bulk high resistivity substrate technology, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
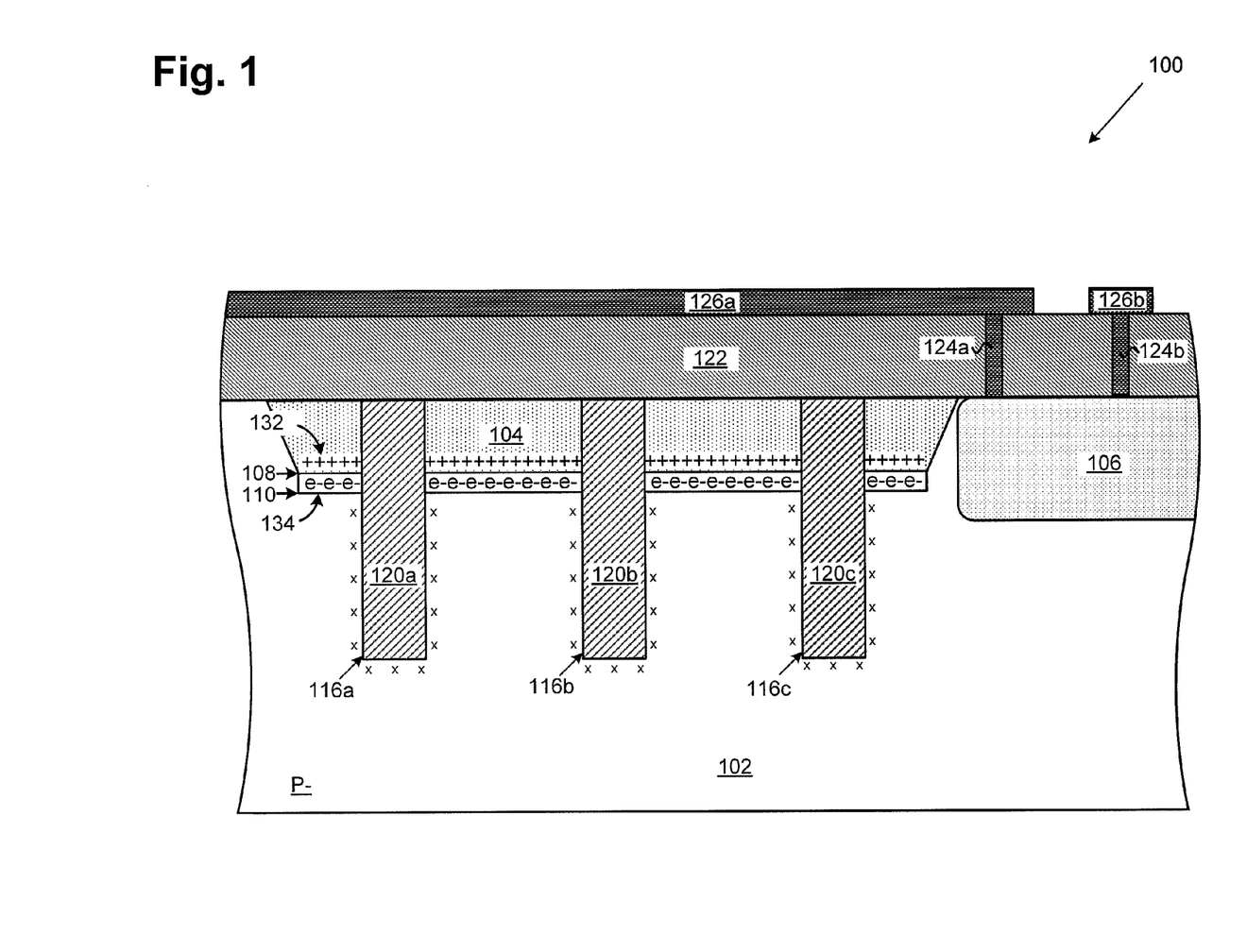
FIG. 1 illustrates a cross-sectional view of a conventional high resistivity substrate structure.

FIG. 1 illustrates a cross-sectional view of a conventional high resistivity substrate structure. Structure 100 includes oxide layer 104 and semiconductor device 106 situated on high resistivity substrate 102. Deep trenches 116a, 116b and 116c extend through oxide layer 104 into high resistivity substrate 102. Contacts 126a and 126b are situated over dielectric layer 122 and make contact with semiconductor device 106 through respective conductive vias 124a and 124b.

As illustrated in FIG. 1, oxide layer 104 contains fixed charges 132 (e.g., positive charges) at the interface of high resistivity substrate 102 and oxide layer 104. Due to the low background doping of high resistivity substrate 102, fixed charges 132 can cause an accumulation of mobile charges of opposite polarity (e.g., negative charges) under oxide layer 104, resulting in the formation of inversion layer 134 of high mobility carriers near interface 108 in high resistivity substrate 102. Inversion layer 134 can significantly reduce the effective resistivity of high resistivity substrate 102. For example, if 1000 ohm-cm silicon is used to build high resistivity substrate 102, the effective resistivity of the substrate is found to be only approximately one fifth of that value (i.e., 200 ohm-cm) based on transmission line measurements over the substrate.

As illustrated in FIG. 1, deep trenches 116a, 116b and 116c extend through oxide layer 104 into high resistivity substrate 102, and are filled with dielectric material 120a, 120b and 120c, respectively. A damaging implant can be applied to high resistivity substrate 102 near each of deep trenches 116a, 116b and 116c to provide carrier traps to reduce carrier mobility in high resistivity substrate 102. However, the damaging implant can re-align to the surrounding substrate at temperatures far below what is typically required for CMOS manufacturing (e.g., 600° C.), which can seriously compromise the effectiveness of the damaging implants. As can be seen in FIG. 1, the damaging implants around each of deep trenches 116a, 116b and 116c are substantially re-align with high resistivity substrate 102 during the manufacturing process, thus having substantially reduced trapping sites around each of deep trenches 116a, 116b and 116c.

In structure 100, not only does inversion layer 134 under oxide layer 104 reduce the effective substrate impedance of high resistivity substrate 102, but because deep trenches 116a, 116b and 116c surrounded by damaging implants partition oxide layer 104 and inversion layer 134 into isolated segments or islands in high resistivity substrate 102, these isolated segments of inversion layer 134 under oxide layer 104 form parasitic p-n junctions with high resistivity substrate 102, for example, at interface 110. These parasitic p-n junction, formed between trapped charges in oxide layer 104 and high resistivity substrate 102, function as voltage dependent diodes, which can adversely impact the linearity of the RF signals routed through metal layers, such as contact 126a, over high resistivity substrate 102. Also, the parasitic capacitive coupling between one or more of the metal layers, such as contact 126a, and high resistivity substrate 120 is also voltage dependent. As such, these parasitic p-n junctions functioning as voltage dependent diodes and the voltage dependent parasitic capacitive coupling functioning as parasitic varactors in high resistivity substrate 102 can contribute to the non-linearity in signals (e.g., RF signals) propagating through metal layers (e.g., contact 126a) over high resistivity substrate 102.

Figure 2:
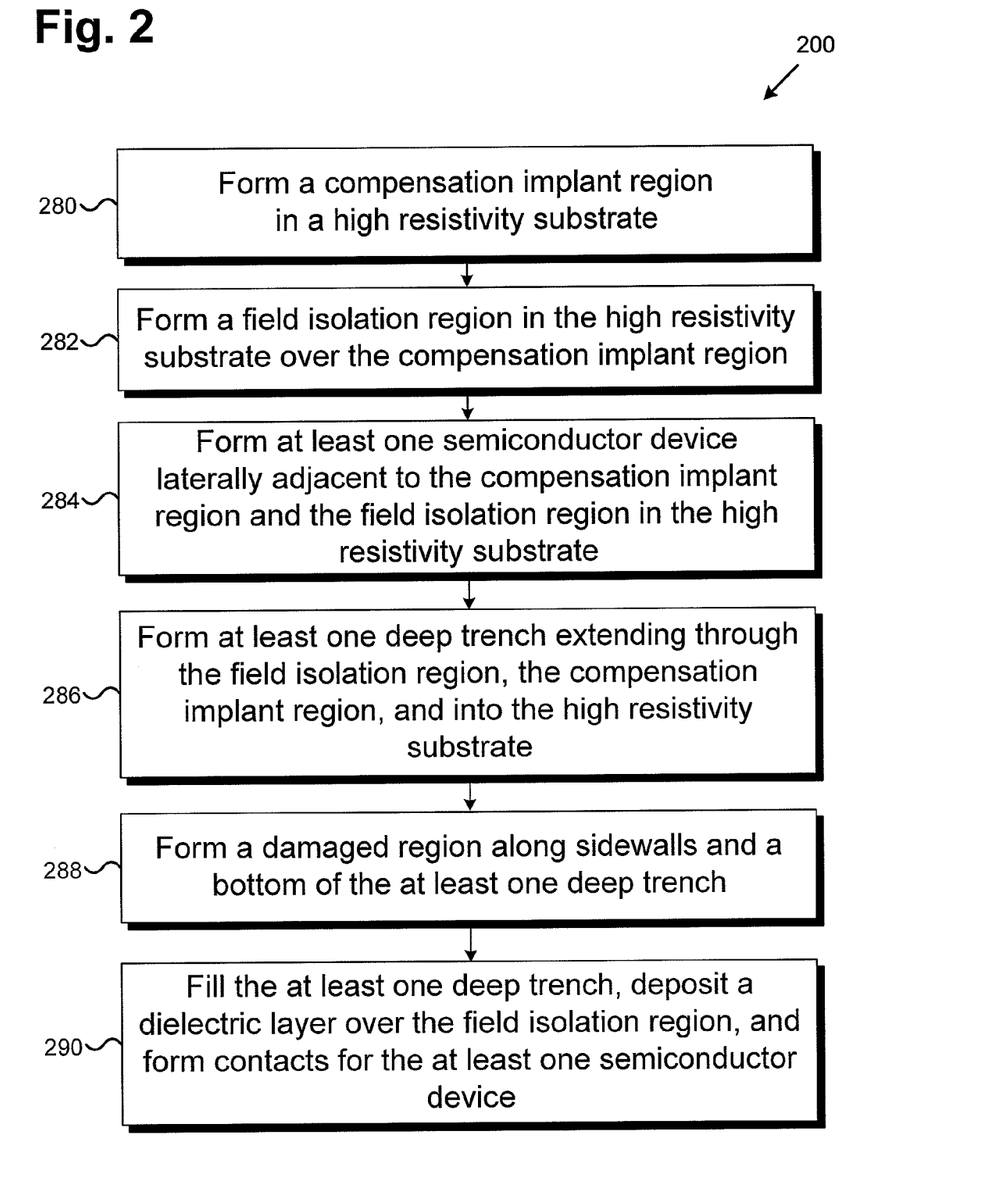
FIG. 2 is a flowchart illustrating a method for fabricating an exemplary structure for mitigating substrate parasitics in a high resistivity substrate according to one implementation of the present application.

FIG. 2 shows a flowchart illustrating an exemplary method of forming a structure for mitigating substrate parasitics in a high resistivity substrate according to one implementation of the present application. Certain details and features have been left out of the flowchart that are apparent to a person of ordinary skill in the art. For example, an action may consist of one or more subactions or may involve specialized equipment or materials, as known in the art. Actions 280, 282, 284, 286, 288 and 290 indicated in flowchart 200 are sufficient to describe one implementation of the present inventive concepts, other implementations of the present inventive concepts may utilize actions different from those shown in flowchart 200. Moreover, structures 380, 382, 384, 386, 388 and 390 in FIGS. 3A, 3B, 3C, 3D, 3E and 3F illustrate the results of performing actions 280, 282, 284, 286, 288 and 290 of flowchart 200, respectively. For example, structure 380 is a portion of an exemplary structure for mitigating substrate parasitics in a high resistivity substrate after processing action 280, structure 382 is a portion of an exemplary structure for mitigating substrate parasitics in a high resistivity substrate after the processing of action 282, structure 384 is a portion of an exemplary structure for mitigating substrate parasitics in a high resistivity substrate after the processing of action 284, and so forth.

Figure 3A:
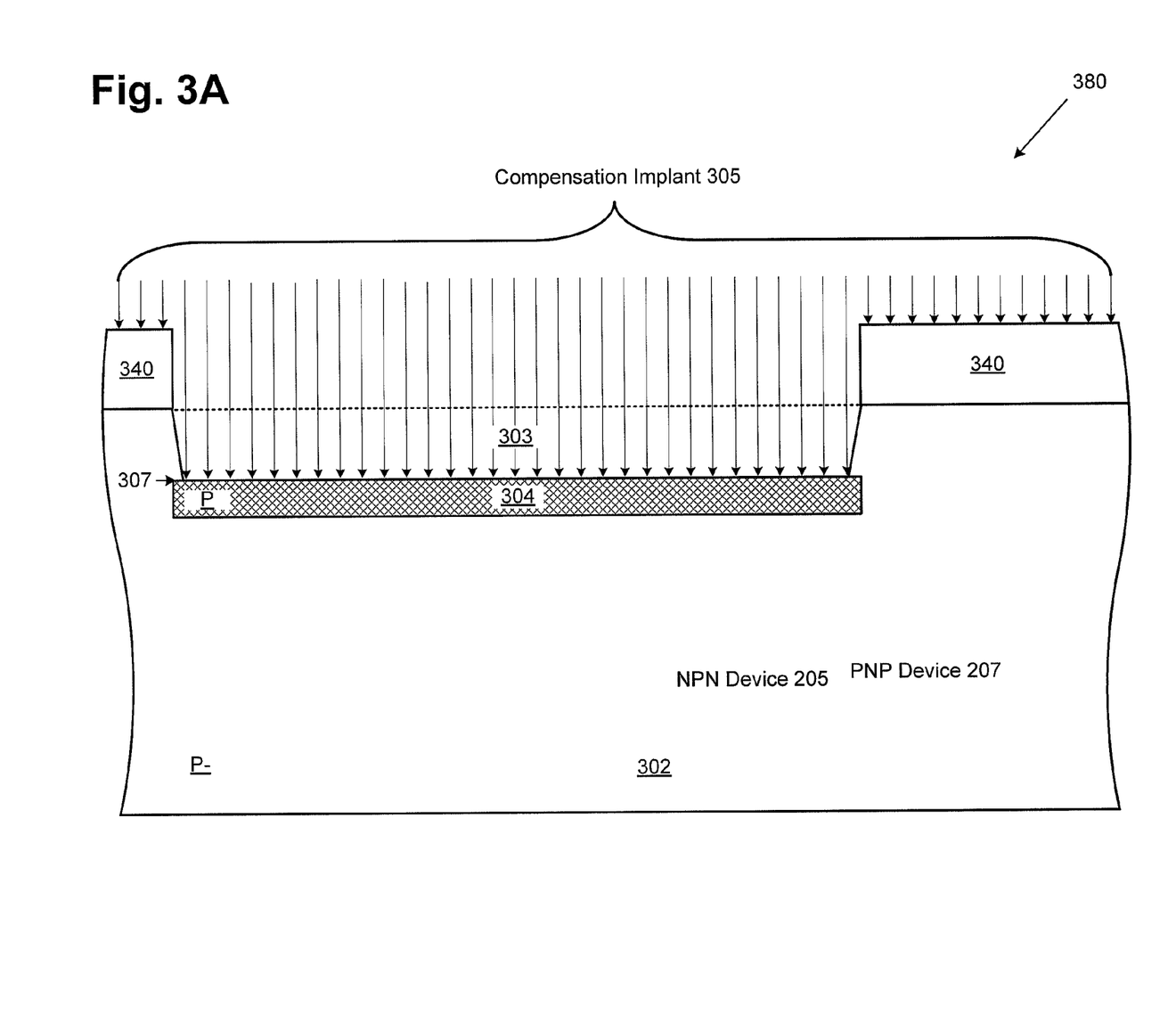
FIG. 3A illustrates a cross-sectional view of a portion of an exemplary structure for mitigating substrate parasitics in a high resistivity substrate processed in accordance with an initial action in the flowchart of FIG. 2 according to one implementation of the present application.

Referring to action 280 in FIG. 2 and structure 380 in FIG. 3A, action 280 includes forming a compensation implant region in a high resistivity substrate. Referring to FIG. 3A, structure 380 illustrates a cross-sectional view of a portion of an exemplary structure for mitigating substrate parasitics in a high resistivity substrate after the processing of action 280 in flowchart 200 of FIG. 2, according to one implementation of the present application. As illustrated in FIG. 3A, structure 380 includes compensation implant region 304 in high resistivity substrate 302.

In the present implementation, high resistivity substrate 302 includes a high resistivity silicon substrate. In other implementations, high resistivity substrate 302 may include other appropriate substrate material, such as silicon germanium or germanium. For example, high resistivity substrate 302 may have a substantially uniform composition, and a substantially uniform resistivity of approximately 1000 ohms-cm. However, high resistivity substrate 302 is not so limited and may have a resistivity greater than or less than this value. In the present implementation, high resistivity substrate 302 is of a first conductivity type, such as P type, by way of example. High resistivity substrate 302 contains positive bulk charges, and is shown as having P-conductivity, by way of example. In another implementation, high resistivity substrate 302 may have a conductivity of N type.

In the present implementation, compensation implant region 304 is of the first conductivity type, such as P type, by way of example. Compensation implant region 304 has a lower resistivity than high resistivity substrate 302, thus is shown as having P conductivity, which is higher than that of high resistivity substrate 302 having P-conductivity. In the present implementation, compensation implant region 304 has a low dopant concentration (e.g., lightly doped). Compensation implant region 304 is configured to compensate the fixed charges in a field isolation region (e.g., field isolation region 306 in FIG. 3B) and substantially eliminate parasitic p-n junctions under the field isolation region in high resistivity substrate 302. In another implementation, for an N type high resistivity substrate, compensation implant region 304 may have a conductivity of N type.

As illustrated in FIG. 3A, field isolation trench 303 is formed in high resistivity substrate 302, for example, by removing (e.g., etching away) a portion of high resistivity substrate 302 not covered by patterned masking layer 340. Then, compensation implant 305 is substantially uniformly implanted across exposed surface 307 of high resistivity substrate 302 while patterned masking layer 340 covers the remaining portions of high resistivity substrate 302. In one implementation, a field isolation nitride (not explicitly shown in FIG. 3A) may be used as a block for compensation implant 305 outside of field isolation trench 303. For a P type high resistivity substrate, compensation implant 305 may include a P type implant, such as boron implant or the like, to form compensation implant region 304. In the present implementation, high resistivity substrate 302 may have a dopant concentration on the order of $10^{13}$ atoms/cm$^3$, which corresponds to a resistivity on the order of 1000 ohm-cm. By contrast, compensation implant region 304 may have a dopant concentration of at least one order of magnitude higher (e.g., $10^{14}$ atoms/cm$^3$) than the dopant concentration of high resistivity substrate 302. In one implementation, compensation implant region 304 may have a dopant concentration on the order of $10^{16}$ atoms/cm$^3$.

It is noted that compensation implant region 304 can be relatively lightly doped and still overwhelm the surface charge to substantially eliminate the parasitic inversion layer under field isolation region 306 in high resistivity substrate 302. It is noted that compensation implant doses in the range of $5 \times 10^{11}$ atoms/cm$^3$ are usually sufficient to prevent the inversion layer. Also, the compensation implant doses should be as low as possible to avoid compromising the high resistivity of high resistivity substrate 302.

It is noted that patterned masking layer 340, which is used to define and form one or more field isolation regions (e.g., field isolation region 306 in FIG. 3B) in high resistivity substrate 302, is in place and used during the formation of compensation implant region 304. Thus, the method of forming a structure for mitigating substrate parasitics in a high resistivity substrate, as described in flowchart 200 does not require an extra masking step in the processing actions, thereby saving manufacturing time and cost.

Figure 3B:
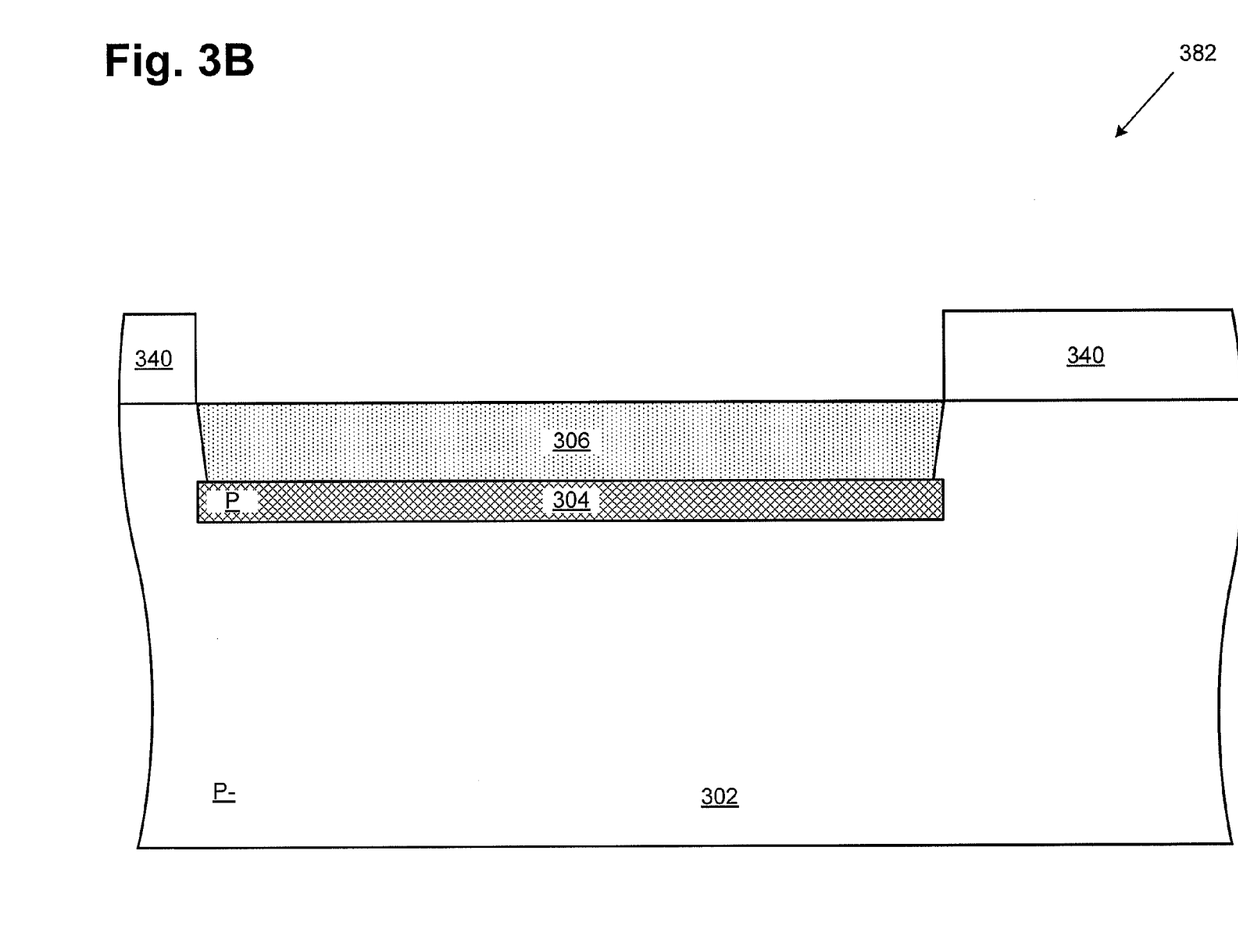
FIG. 3B illustrates a cross-sectional view of a portion of an exemplary structure for mitigating substrate parasitics in a high resistivity substrate processed in accordance with an intermediate action in the flowchart of FIG. 2 according to one implementation of the present application.

Referring to action 282 in FIG. 2 and structure 382 in FIG. 3B, action 282 includes forming a field isolation region in the high resistivity substrate over the compensation implant region. Referring to FIG. 3B, structure 382 illustrates a cross-sectional view of a portion of an exemplary structure for mitigating substrate parasitics in a high resistivity substrate after the processing of action 282 in flowchart 200 of FIG. 2, according to one implementation of the present application. As illustrated in FIG. 3B, structure 382 includes field isolation region 306 in high resistivity substrate 302 over compensation implant region 304.

As illustrated in FIG. 3B, patterned masking layer 340 used during the formation of compensation implant region 304 in FIG. 3A, is still in place for the formation of field isolation region 306. In an implementation, field isolation region 306 may be formed by depositing a semiconductor material (e.g., silicon) in field isolation trench 303, oxidizing (e.g., thermal oxidation) semiconductor material, and planarizing the oxidized semiconductor material with a top surface of high resistivity substrate 302. In another implementation, field isolation region 306 may be formed by filling field isolation trench 303 with an insulative material, such as an insulative oxide (e.g., silicon dioxide), and planarizing the oxidized semiconductor material with a top surface of high resistivity substrate 302. In the present implementation, field isolation region 306 is a shallow trench isolation region in high resistivity substrate 302. In another implementation, field isolation region 306 may be a local oxidation of silicon (e.g., LOCOS) region in high resistivity substrate 302. As illustrated in FIG. 3B, field isolation region 306 is situated in field isolation trench 303 in high resistivity substrate 302, and in the opening defined by patterned masking layer 340. Field isolation region 306 extends into high resistivity substrate 302, and is in contact with compensation implant region 304 at surface 307.

The formation of field isolation region 306 in high resistivity substrate 302 results in an accumulation of fixed charges in field isolation region 306 near its bottom surface. Without the presence of compensation implant region 304, an inversion layer (e.g., inversion layer 134 in FIG. 1) near the interface of field isolation region 306 and high resistivity substrate 302 would have been resulted due to the fixed charge near the bottom surface of field isolation region 306. Compensation implant region 304, for example, a lightly doped P region, is configured to compensate parasitic charges (e.g., electrons) under field isolation region 306. Compensation implant region 304 can overwhelm the surface charge to substantially eliminate the inversion layer and the parasitic p-n junctions under field isolation region 306 in high resistivity substrate 302.

It is noted that in actions 280 and 282 along with the corresponding structures 380 and 382, patterned masking layer 340 is used to define and form compensation implant region 304, and one or more field isolation regions (e.g., field isolation region 306) in high resistivity substrate 302. Thus, the method of forming a structure for mitigating substrate parasitics in a high resistivity substrate, as described in flowchart 200, does not require an extra masking step in the processing actions, thereby saving manufacturing time and cost.

Figure 3C:
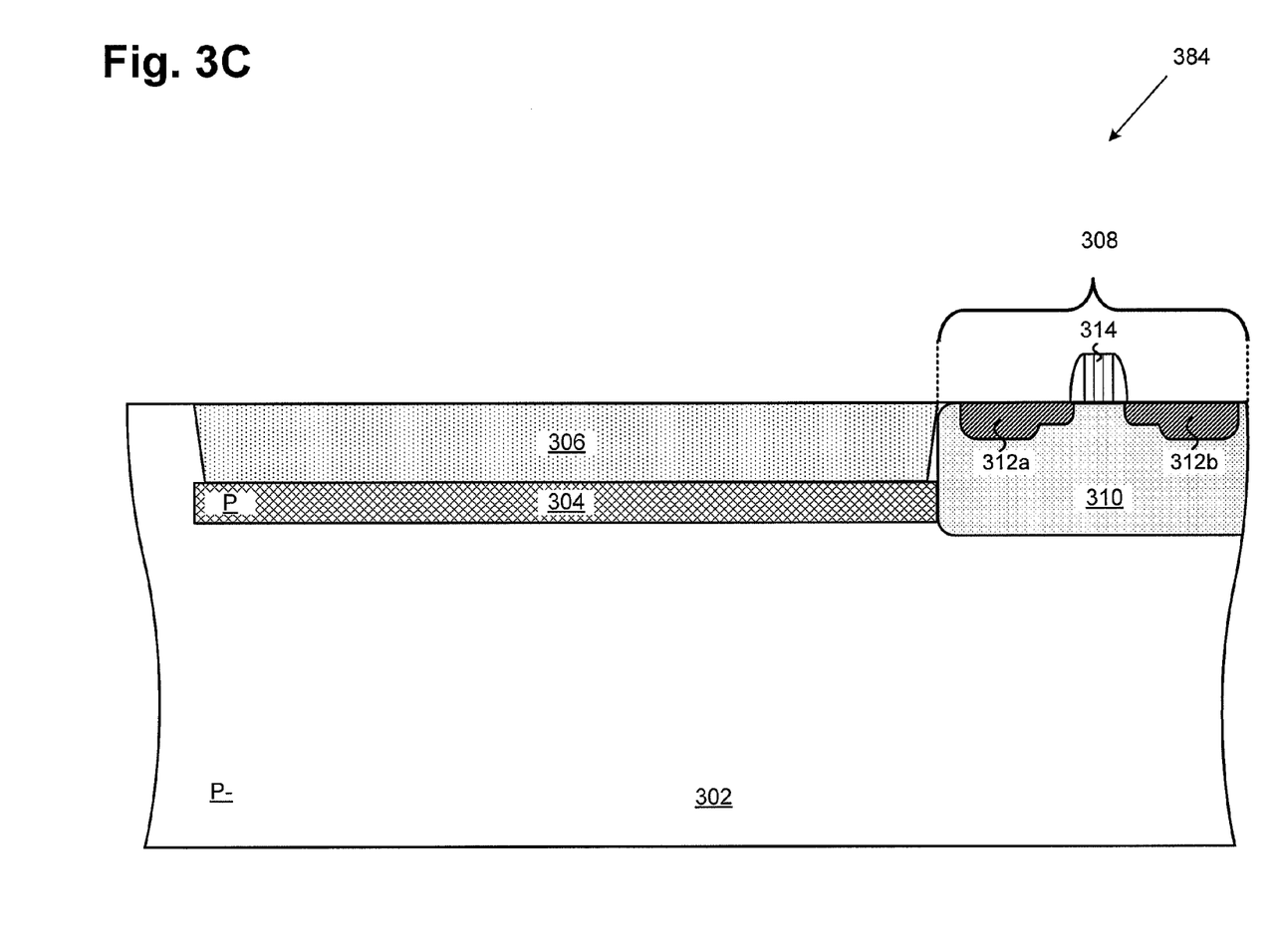
FIG. 3C illustrates a cross-sectional view of a portion of an exemplary structure for mitigating substrate parasitics in a high resistivity substrate processed in accordance with an intermediate action in the flowchart of FIG. 2 according to one implementation of the present application.

Referring to action 284 in FIG. 2 and structure 384 in FIG. 3C, action 284 includes forming at least one semiconductor device laterally adjacent to the compensation implant region and the field isolation region in the high resistivity substrate. Referring to FIG. 3C, structure 384 illustrates a cross-sectional view of a portion of an exemplary structure for mitigating substrate parasitics in a high resistivity substrate after the processing of action 284 in flowchart 200 of FIG. 2, according to one implementation of the present application. As illustrated in FIG. 3C, structure 384 includes semiconductor device 308 laterally adjacent to compensation implant region 304 and field isolation region 306 in high resistivity substrate 302.

In the present implementation, semiconductor device 308 includes source/drain regions 312a and 312b formed in well region 310 of the first conductivity (e.g., P type), and gate structure 314 over well region 310. Semiconductor device 308 may be formed in any suitable method known in the art. In one implementation, source/drain regions 312a and 312b, and gate structure 314 are formed, for example, using standard methods, including, but not limited to, well creation, active formation, gate formation, polysilicon processing, lightly doped drain processing, spacers formation, source and drain implanting, and any other actions necessary to fabricate a transistor or any other type of semiconductor device.

It is noted that structure 384 in action 284 may be subjected to the highest thermal budget in the processing actions described in flowchart 200. For example, source/drain implants in source/drain regions 312a and 312b may be activated in action 284. It is noted that compensation implant region 304 is formed before source/drain regions 312a and 312b, and before gate structure 314. As such, the high temperature budget used to activate the source/drain implants in source/drain regions 312a and 312b is also sufficient to activate the implants in compensation implant region 304 during the same process, thereby saving manufacturing time and cost.

In the present implementation, semiconductor device 308 may be a field effect transistor (FET), such as an N-FET. In another implementation, semiconductor device 308 may include other suitable semiconductor devices, such as a bipolar complementary-metal-oxide-semiconductor (BiCMOS) device. In other implementations, semiconductor device 308 may include a passive device, such as a capacitor, an inductor, a resistor, a transformer, an antenna or any other type of passive device.

Figure 3D:
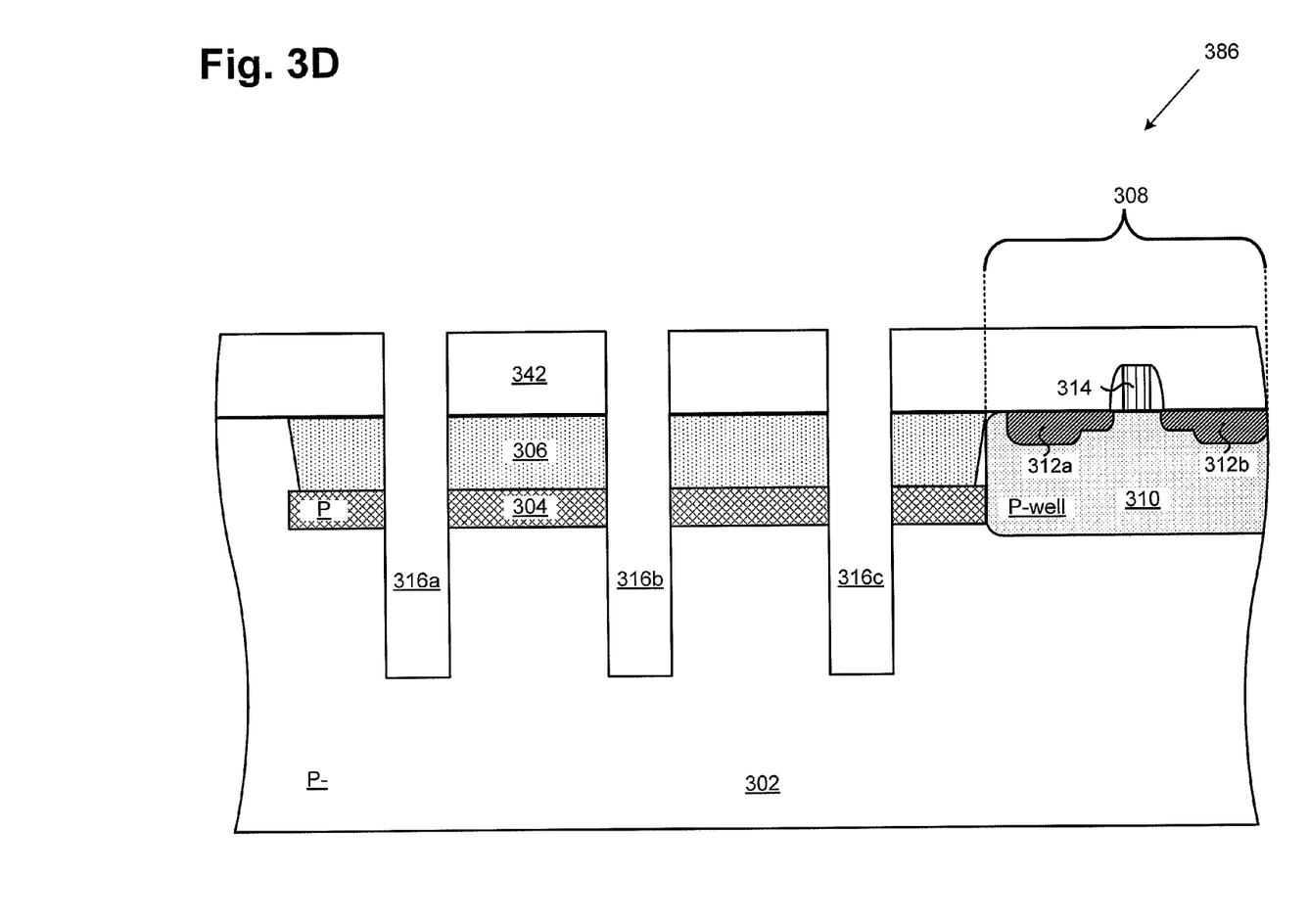
FIG. 3D illustrates a cross-sectional view of a portion of an exemplary structure for mitigating substrate parasitics in a high resistivity substrate processed in accordance with an intermediate action in the flowchart of FIG. 2 according to one implementation of the present application.

Referring to action 286 in FIG. 2 and structure 386 in FIG. 3D, action 286 includes forming at least one deep trench extending through the field isolation region, the compensation implant region, and into the high resistivity substrate. Referring to FIG. 3D, structure 386 illustrates a cross-sectional view of a portion of an exemplary structure for mitigating substrate parasitics in a high resistivity substrate after the processing of action 286 in flowchart 200 of FIG. 2, according to one implementation of the present application. As illustrated in FIG. 3D, structure 386 includes deep trenches 316a, 316b and 316c extending through field isolation region 306, compensation implant region 304, and into high resistivity substrate 302. As illustrated in FIG. 3D, deep trenches 316a, 316b and 316c are substantially parallel to one another, and are laterally adjacent to semiconductor device 308. In the present implementation, deep trenches 316a, 316b and 316c each include vertical sidewalls and a substantially flat bottom. In another implementation, deep trenches 316a, 316b and 316c may each include substantially tapered sidewalls and/or a round bottom. As illustrated in FIG. 3D, deep trenches 316a, 316b and 316c partition field isolation region 306 and compensation implant region 304 into isolated segments to further localize carriers (e.g., free electrons) in high resistivity substrate 302.

In the present implementation, patterned deep trench mask 342 can be used to mask semiconductor device 308 and portions of field isolation region 306. Thereafter, deep trenches 316a, 316b and 316c can be formed by removing (e.g., etching away) portions of field isolation region 306, compensation implant region 304, and high resistivity substrate 302 in the openings defined by patterned deep trench mask 342.

It is noted that, before the formation of deep trenches 316a, 316b and 316c, it is important for semiconductor device 308 to have already received its implants (e.g., source and drain implants) and annealing treatment to activate the implants to avoid subjecting a subsequently formed damaged region on the sidewalls and bottom of each of deep trenches 316a, 316b and 316c to high thermal budgets. Thus, high temperature cycles, such as anneal, are done before the formation of deep trenches 316a, 316b and 316c. It is noted that the high temperature budget used to activate the source and drain implants in well region 310 is also sufficient to activate the implants in compensation implant region 304 during the same process. Thus, it is important that compensation implant region 304 is formed before semiconductor device 308.

Figure 3E:
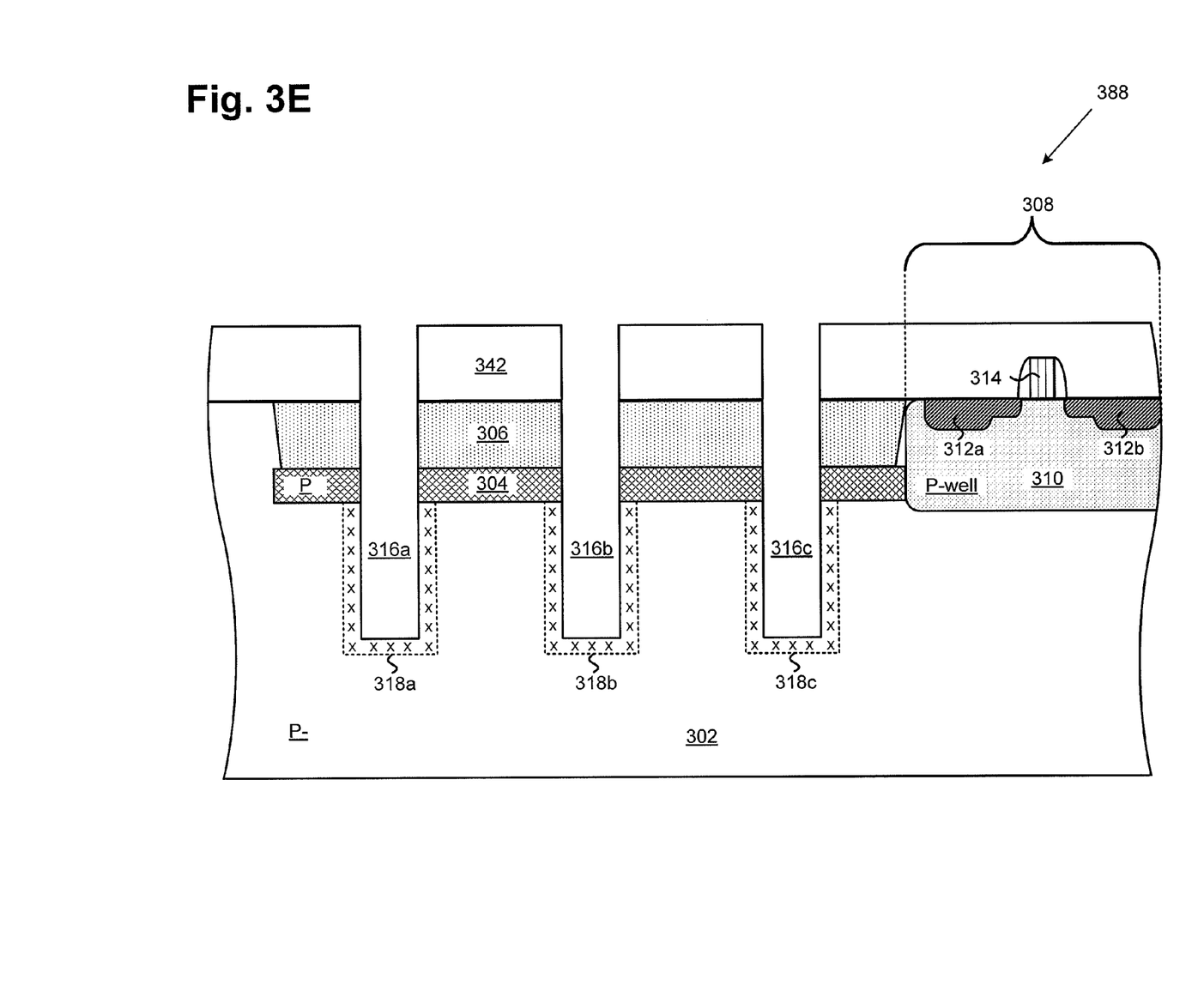
FIG. 3E illustrates a cross-sectional view of a portion of an exemplary structure for mitigating substrate parasitics in a high resistivity substrate processed in accordance with an intermediate action in the flowchart of FIG. 2 according to one implementation of the present application.

Referring to action 288 in FIG. 2 and structure 388 in FIG. 3E, action 288 includes forming a damaged region along sidewalls and a bottom of the at least one deep trench. Referring to FIG. 3E, structure 388 illustrates a cross-sectional view of a portion of an exemplary structure for mitigating substrate parasitics in a high resistivity substrate after the processing of action 288 in flowchart 200 of FIG. 2, according to one implementation of the present application. As illustrated in FIG. 3E, structure 388 includes damaged regions 318a, 318b and 318c along the respective sidewalls and the bottom of deep trenches 316a, 316b and 316c in high resistivity substrate 302.

As illustrated in FIG. 3E, patterned deep trench mask 342 used to form deep trenches 316a, 316b and 316c in action 286, can be used during the formation of damaged regions 318a, 318b and 318c. For example, a damaging implant (not explicitly shown in FIG. 3E), such as an amorphizing inert implant, can be applied to create defects in high resistivity substrate 302 along the sidewalls and bottom each of deep trenches 316a, 316b and 316c. In one implementation, the damaging implant may include a heavy element such as Argon or Xenon, and may be applied at an appropriate implant energy, for example.

As illustrated in FIG. 3E, damaged regions 318a, 318b and 318c extend into high resistivity substrate 302 at a greater depth than well region 310. Damaged regions 318a, 318b and 318c may each contain a high density of carrier traps that significantly reduce the mobility of carriers in damaged regions 318a, 318b and 318c, as compared to undamaged portions of high resistivity substrate 302 well region 310. The carrier traps significantly reduce carrier mobility in damaged regions 318a, 318b and 318c, making damaged regions 318a, 318b and 318c insensitive to any voltage potential present above deep trenches 316a, 316b and 316c. Damaged regions 318a, 318b and 318c also provide electrical isolation and improve linearity for semiconductor devices (e.g., semiconductor device 308) situated in high resistivity substrate 302.

It should be noted that damaged regions 318a, 318b and 318c along the sidewalls and the bottom of each of deep trenches 316a, 316b and 316c would epitaxial re-align to high resistivity substrate 302 if subjected to temperature above 600° C., which would defeat the purpose of having such damaging implants. However, since semiconductor device 308 has already received its implants (e.g., source and drain implants) and annealing treatment (e.g., over 1000° C.) to activate the implants in source/drain regions 312a and 312b in action 284, damaged regions 318a, 318b and 318c along the sidewalls and the bottom of each of deep trenches 316a, 316b and 316c are not subjected to high thermal budgets, thus can avoid epitaxially re-alignment to high resistivity substrate 302.

Figure 3F:
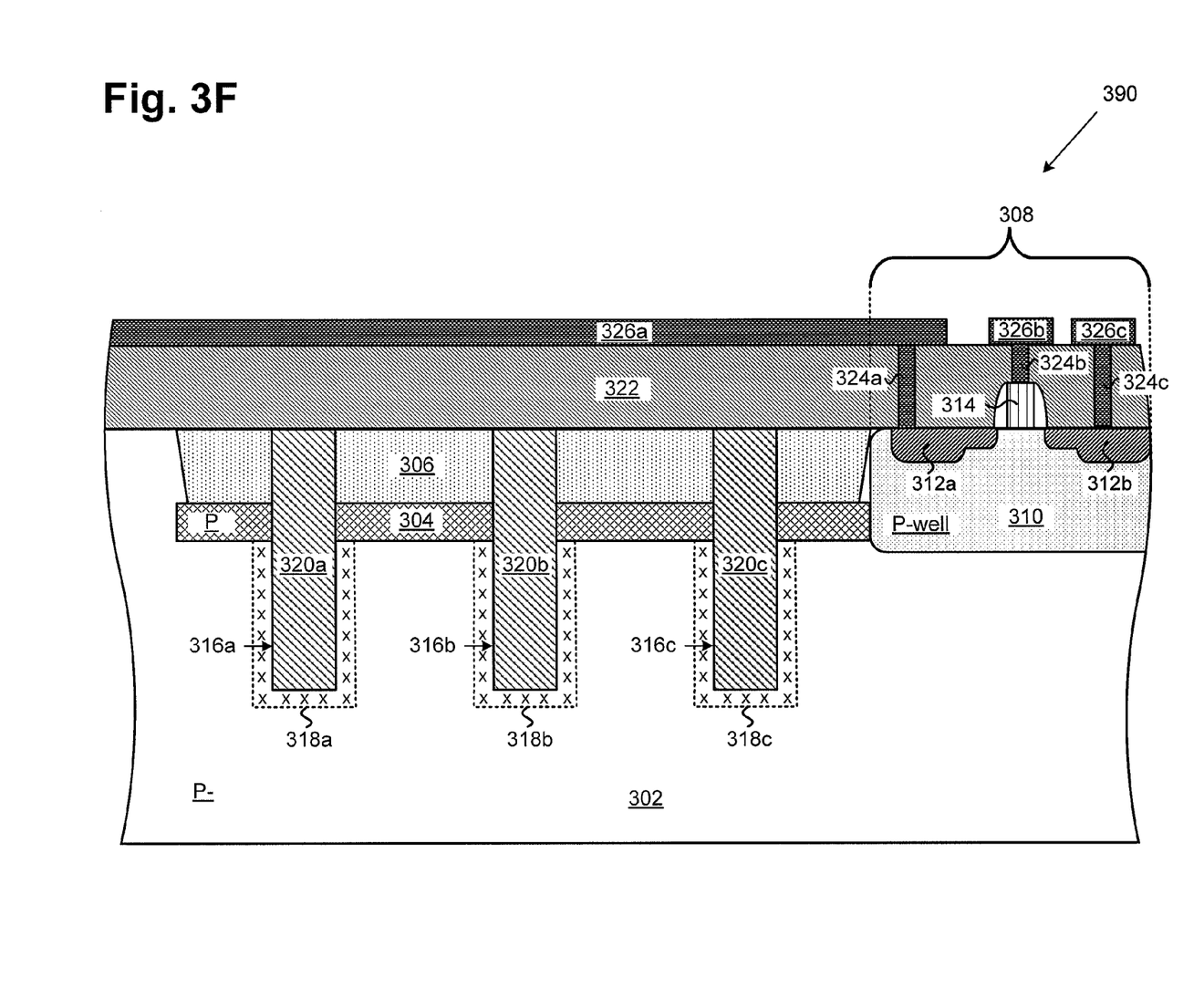
FIG. 3F illustrates a cross-sectional view of a portion of an exemplary structure for mitigating substrate parasitics in a high resistivity substrate processed in accordance with a final action in the flowchart of FIG. 2 according to one implementation of the present application.

Referring to action 290 in FIG. 2 and structure 390 in FIG. 3F, action 290 includes filling the at least one deep trench, depositing a dielectric layer over the field isolation region, and forming contacts for the at least one semiconductor device. Referring to FIG. 3F, structure 390 illustrates a cross-sectional view of a portion of an exemplary structure for mitigating substrate parasitics in a high resistivity substrate after the processing of action 290 in flowchart 200 of FIG. 2, according to one implementation of the present application. As illustrated in FIG. 3F, structure 390 includes deep trench dielectric fillers 320a, 320b and 320c in deep trenches 316a, 316b and 316c, respectively, dielectric layer 322 over field isolation region 306, and contacts 326a, 326b and 326c for semiconductor device 308.

As illustrated in FIG. 3F, deep trench dielectric fillers 320a, 320b and 320c fill the entire space in deep trenches 316a, 316b and 316c, respectively. Deep trench dielectric fillers 320a, 320b and 320c each extend through field isolation region 306, compensation implant region 304, and into high resistivity substrate 302. In the present implementation, deep trench dielectric fillers 320a, 320b and 320c may include borophosphosilicate (BPSE) or other types of doped glasses. In other implementations, deep trench dielectric fillers 320a, 320b and 320c may include any suitable dielectric material, such as insulating oxide or nitride material. Deep trench dielectric fillers 320a, 320b and 320c together with field isolation region 306 improve electrical isolation between semiconductor devices, such as semiconductor device 308, in high resistivity substrate 302.

As illustrated in FIG. 3F, dielectric layer 322 is formed over the top surface of high resistivity substrate 302, and covers field isolation region 306 and deep trench dielectric fillers 320a, 320b and 320c in respective deep trenches 316a, 316b and 316c. Dielectric layer 322 is also formed over semiconductor device 308, and covers source/drain regions 312a and 312b, and gate structure 314. Dielectric layer 322 may include any suitable dielectric material, such as insulating oxide or nitride material.

As illustrated in FIG. 3F, contacts 326a, 326b and 326c makes electrical contact with source/drain region 312a, gate structure 314 and source/drain region 312b of semiconductor device 308 through conductive vias 324a, 324b and 324c, respectively. Contacts 326a, 326b and 326c may be parts of a metallization layer (e.g., metal one layer) formed on dielectric layer 322. In one implementation, contacts 326a, 326b and 326c and conductive vias 324a, 324b and 324c may be formed within and/or on dielectric layer 322 by any suitable low temperature method. In one implementation, a blanket deposition of a conductive metal followed by a patterned etch may be utilized if the conductive metallization layer is aluminum based. In another implementation, a subtractive damascene process may be utilized if the conductive metallization layer is copper based.

In the present implementation, compensation implant region 304 having a lightly doped region of the first conductivity type, is configured to compensate parasitic charges of the second conductivity type under field isolation region 306. Compensation implant region 304 is configured to substantially eliminate one or more parasitic p-n junctions under field isolation region 306, where the parasitic p-n junctions in absence of compensation implant region 304 would otherwise be formed between trapped charges in field isolation region 306 and high resistivity substrate 302. Compensation implant region 304 is configured to improve linearity of RF signals propagating through a metallization layer (e.g., contact 326a) over field isolation region 306. Also, damaged regions 318a, 318b and 318c surrounding deep trenches 316a, 316b and 316c in high resistivity substrate 302 are configured to provide carrier traps to make the carriers insensitive to any voltage potential present above field isolation region 306, thereby improving linearity performance.

Implementations of the present application utilize a compensation implant region under a field isolation region to compensate the fixed charges in the field isolation region, thus substantially eliminating an inversion layer under the field isolation region and parasitic p-n junctions in a high resistivity substrate. Implementations of the present application also utilize damaged implant regions surrounding one or more deep trenches in the high resistivity substrate to provide carrier trapping sites to make the carriers insensitive to any voltage potential present above the field isolation region. Thus, implementations of the present application improve linearity performance in RF circuits such as RF switches by greatly reducing the voltage sensitivity of parasitic voltage dependent p-n junction diodes and parasitic voltage dependent varactors under field isolation region of the high resistivity substrate. The specific advantages of improved linearity will depend on the product, but generally will result in less spectral interference. For example, modern cell phone front-end modules require very linear RF switches to enable more efficient use of the available cellular spectrum.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A structure comprising:
    a field isolation region in a high resistivity substrate;
    a compensation implant region under said field isolation region in said high resistivity substrate;
    a damaged region below said compensation implant region;
    wherein said compensation implant region is configured to substantially eliminate a parasitic p-n junction under said field isolation region, wherein said parasitic p-n junction is formed between trapped charges in said field isolation region and said high resistivity substrate, said high resistivity substrate having a resistivity of about 1000 ohms-cm or greater.

2. The structure of claim 1 further comprising a deep trench extending through said field isolation region and said compensation implant region.

3. The structure of claim 2 wherein said damaged region is adjacent said deep trench.

4. The structure of claim 1 wherein said compensation implant region comprises a charge of a first conductivity type to compensate a parasitic charge of a second conductivity type under said field isolation region.

5. The structure of claim 1 wherein said compensation implant region is configured to improve linearity of RF signals propagating through a metallization layer over said field isolation region.

6. The structure of claim 1 wherein said high resistivity substrate and said compensation implant region have a first conductivity type.

7. The structure of claim 1 wherein said compensation implant region has a dopant concentration of at least one order of magnitude higher than a dopant concentration of said high resistivity substrate.

8. The structure of claim 1 wherein said field isolation region comprises a shallow trench isolation region.

9. The structure of claim 1 further comprising at least one semiconductor device.

10. A method comprising:
    forming a compensation implant region in a high resistivity substrate;
    forming a field isolation region over said compensation implant region;
    forming a damaged region below said compensation implant region;
    wherein said compensation implant region is configured to substantially eliminate a parasitic p-n junction under said field isolation region, wherein said parasitic p-n junction is formed between trapped charges in said field isolation region and said high resistivity substrate, said high resistivity substrate having a resistivity of about 1000 ohms-cm or greater.

11. The method of claim 10 further comprising forming at least one deep trench extending through said field isolation region, said compensation implant region, and into said high resistivity substrate.

12. The method of claim 11 wherein said damage region is adjacent said deep trench.

13. The method of claim 11 further comprising filling said at least one deep trench and forming a dielectric layer over said field isolation region.

14. The method of claim 10 wherein said compensation implant region comprises a charge of a first conductivity type to compensate a parasitic charge of a second conductivity type under said field isolation region.

15. The method of claim 10 wherein said compensation implant region is configured to improve linearity of RF signals propagating through a metallization layer over said field isolation region.

16. The method of claim 10 further comprising forming at least one semiconductor device.

17. The method of claim 10 wherein said high resistivity substrate and said compensation implant region have a first conductivity type.

18. The method of claim 10 wherein said compensation implant region has a dopant concentration of at least one order of magnitude higher than a dopant concentration of said high resistivity substrate.

* * * * *